US006342291B1

(12) United States Patent
Jonsson et al.

(10) Patent No.: US 6,342,291 B1
(45) **Date of Patent: *Jan. 29, 2002**

(54) COATED GROOVING OR PARTING INSERT AND METHOD OF MAKING SAME

(75) Inventors: Anders Jonsson, Gävle; Anders Piirhonen, Sandviken; Torbjörn Selinder, Stockholm; Gregor Kullander, Älvsjö, all of (SE)

(73) Assignee: Sandvik AB, Sandviken (SE)

(*) Notice: Subject to any disclaimer, the term of this patent is extended or adjusted under 35 U.S.C. 154(b) by 0 days.

This patent is subject to a terminal disclaimer.

(21) Appl. No.: 09/652,026

(22) Filed: Aug. 31, 2000

(30) Foreign Application Priority Data

Sep. 1, 1999 (SE) .............................................. 9903089

(51) Int. Cl.[7] .................................................. B32B 9/00

(52) U.S. Cl. ........................... 428/216; 51/307; 51/309; 428/325; 428/336; 428/697; 428/698; 428/699

(58) Field of Search ................................ 428/216, 336, 428/698, 699, 325, 472, 469, 697; 51/307, 309

(56) References Cited

U.S. PATENT DOCUMENTS 5,705,263 A * 1/1998 Lenander et al. ........... 428/216
5,776,588 A * 9/1998 Moriguchi et al. ......... 407/119
5,882,777 A * 3/1999 Kukino et al. .............. 407/119
5,945,207 A * 8/1999 Kutscher et al. ............ 407/119
6,015,614 A * 1/2000 Ruppi ........................ 407/119
6,062,776 A 5/2000 Sandman et al.
6,250,855 B1 * 6/2001 Persson et al. ............. 428/216

FOREIGN PATENT DOCUMENTS

| | | |
|---|---|---|
| EP | 0 701 982 | 3/1996 |
| EP | 1 038 989 | 9/2000 |
| WO | 97/20083 | 6/1997 |
| WO | 09/534006 | 3/2000 |

OTHER PUBLICATIONS

English abstract of JP07097679 published Apr. 1995.*
Derwent Abstract No. 1999–52090, Week 199944, *Abstract of Japan*, Aug. 17, 1999.

* cited by examiner

*Primary Examiner*—Archene Turner
(74) *Attorney, Agent, or Firm*—Burns, Boane, Swecker & Mathis, L.L.P.

(57) ABSTRACT

The present invention relates to a coated cutting tool (e.g.—cemented carbide insert) useful for grooving or parting of steel or stainless steel components such as tubes and bars. The insert is characterised by a WC-Co-based cemented carbide substrate having a highly W-alloyed Co-binder phase and a hard and wear resistant coating including a multilayered structure of sublayers of the composition $(Ti_xAl_{1-x})N$ with a periodic and repeated variation of the Ti/Al ratio.

3 Claims, 1 Drawing Sheet

COATED GROOVING OR PARTING INSERT AND METHOD OF MAKING SAME

BACKGROUND OF THE INVENTION

1. Field of the Invention

Figure 1:
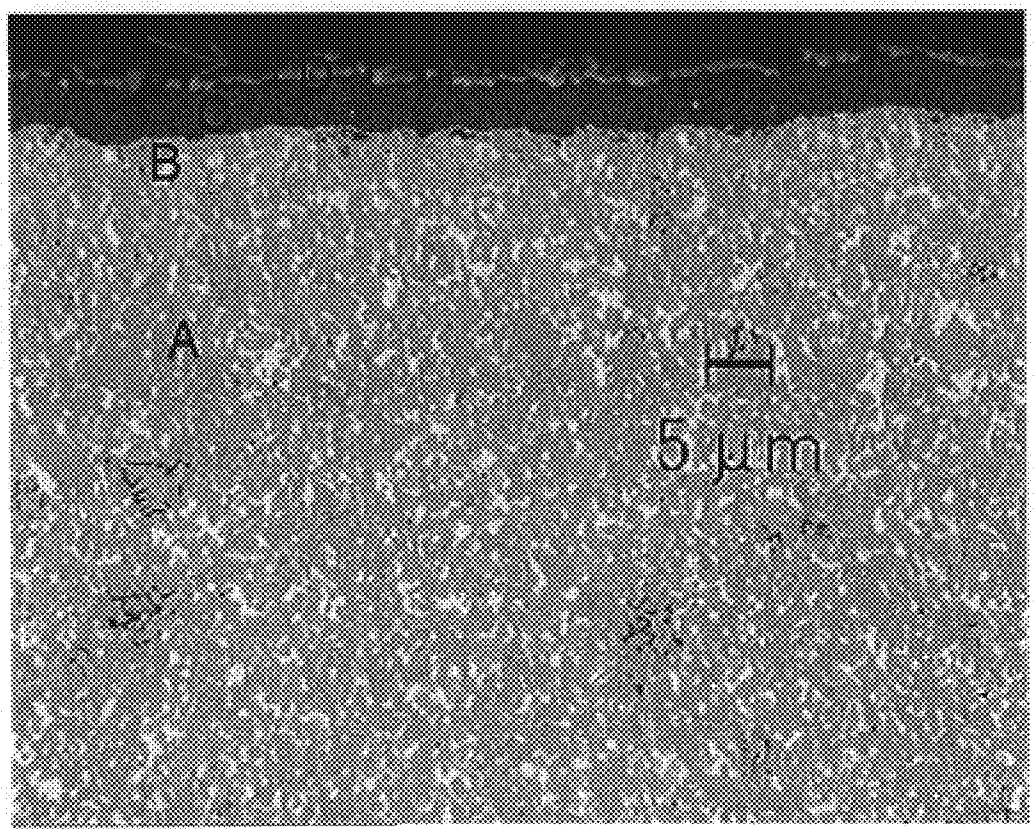

The present invention relates to a coated cutting tool (cemented carbide insert) useful for grooving or parting of steel components, such as bars or tubes, not only of stainless steels of different compositions and microstructures but also of non-stainless steels such as low carbon steels and low and medium alloyed steels.

2. Description of Related Art

In the discussion of the state of the art that follows, reference is made to certain structures and/or methods. However, the following references should not be construed as an admission that these structures and/or methods constitute prior art. Applicant expressly reserves the right to demonstrate that such structures and/or methods do not qualify as prior art against the present invention.

When machining low and medium alloyed steels and stainless steels with cemented carbide tools, the cutting edge is worn according to different wear mechanisms. Examples of such mechanisms include chemical wear, abrasive wear, adhesive wear and edge chipping. In bad cutting conditions problems with bulk and edge line breakages commonly occur. Furthermore, different cutting variables, such as cutting speed and cutting feed rate, and external conditions, such as dry or wet machining and heavy vibrations of the work piece, require a plurality of different properties of the cutting edge.

It has been very difficult to improve all of the plurality of preferred tool properties simultaneously. Therefore, commercial cemented carbide grades have been optimized with respect to one or only a few of these wear types and, hence, to specific application areas. U.S. Pat. No. 6,062,776 discloses a coated cutting insert particularly useful for dry and wet machining in low and medium alloyed steels and stainless steels, with or without raw surface zones, under severe conditions such as vibration, long overhang, and recutting of chips. The insert is characterized by a WC-Co cemented carbide with a low content of cubic carbides, a rather low W-alloyed binder phase, and a coating including an innermost layer of $TiC_xN_yO_z$ with columnar grains and a top layer of TiN and an inner layer of κ-$Al_2O_3$.

Swedish patent application SE 9901149-6 discloses a coated cutting insert, particularly useful at high cutting speeds, for use on stainless steels of different compositions and microstructures. The insert is also useful for the milling of non-stainless steels such as low carbon steels and low and medium alloyed steels. The coated WC-Co based cemented carbide insert is characterized by a specific composition range of WC/Co without any addition of cubic carbides, a low W-alloyed Co binder, a narrowly defined range of average WC grainsizes, and a hard and wear resistant coating including a multilayered structure of sublayers of the composition $(Ti_xAl_{1-x})N$ with repeated variation of the Ti/Al ratio.

SUMMARY OF THE INVENTION

It has now surprisingly been found that a combination of a modified cemented carbide substrate described in the above mentioned U.S. Pat. No. 6,062,776 and the coating described in the above mentioned SE 9901149-6 results in excellent cutting performance in grooving or, in particular, parting of steel, including stainless steel.

A cutting tool insert, for parting of steel and stainless steel, and a method of making the same is provided. The cutting tool insert is comprised of a cemented carbide body and a coating wherein the cemented carbide body consists of WC with an average grain size of about 1.4 mm, 12–13 wt-% Co, 0.4–1.8 wt-% TaC+NbC, and a low W-alloyed binder phase with a CW-ratio of 0.82–0.91. The coating is comprised of a multiple layers. The first (innermost) layer is 0.1–0.5 μm of TiN. A second layer is comprised of a multilayered structure of 0.05–0.2 μm thick sublayers. The sublayers are of a composition $(Ti_xAl_{1-x})N$ in which x varies repeatedly between the two ranges $0.45<x<0.55$ and $0.70<x<0.80$. A first sublayer, adjacent to the TiN bonding layer, is of a composition $(Ti_xAl_{1-x})N$ having an x-value of $0.45<x<0.55$. A second sublayer is of a composition $(Ti_xAl_{1-x})N$ having an x-value of $0.70<x<0.80$ and a third sublayer is of a composition $(Ti_xAl_{1-x})N$ having x of $0.45<x<0.55$. The sequence of sublayers alternates and repeats until 12–25 sublayers are built up. After the multilayered structure, a third layer of $(Ti_xAl_{1-x})N$, where x is $0.45<x<0.55$, is deposited to a thickness of 0.1–0.5 μm. A fourth and outermost layer of TiN is deposited to a thickness of 0.1–0.2 μm. The total coating thickness is 1–8 mm and the thickness of the second layer constitutes 75–95% of the total coating thickness.

BRIEF DESCRIPTION OF THE DRAWING FIGURE

The objects and advantages of the invention will become apparent from the following detailed description of preferred embodiments thereof in connection with the accompanying drawings in which like numerals designate like elements and in which:

FIG. 1 is a micrograph of a polished cross section of a coated insert according to the present invention.

DETAILED DESCRIPTION OF PREFERRED EMBODIMENTS

FIG. 1 shows a micrograph at 1200× magnification of a polished cross section of a coated insert according to the present invention in which the layers of the cross section are visible. The layers are a cemented carbide body A, an innermost TiN layer B, a layer of several TiAlN sublayers C, a layer of TiAlN D, and an outermost TiN layer E.

According to the present invention, there is provided a coated cutting tool insert that satisfies the toughness demands of machining operations such as the grooving and parting of stainless steels. The coated cutting tool insert comprises a WC-Co based cemented carbide body with a composition of 11.5–13.6 wt % Co, preferably 12.0–13.0 wt % Co, most preferably 12.3–12.9 wt % Co, 0.2–1.8 wt % cubic carbides, preferably 0.4–1.8 wt % cubic carbides, most preferably 0.5–1.7 wt % cubic carbides of the metals Ta, Nb and Ti and balance WC. The cemented carbide may also contain other carbides from elements from group IVb, Vb or VIb of the periodic table. The content of Ti is preferably on a level corresponding to a technical impurity. The average grain size of the WC is about 1.1–2.1 μm, preferably about 1.4 μm.

The cobalt binder phase is rather low and alloyed with W. The content of W in the binder phase can be expressed as the CW-ratio:

$$\text{CW-ratio}=M_s/(\text{wt \% Co}\cdot 0.0161) \quad (1)$$

where $M_s$ is the saturation magnetization of the cemented carbide body in kA/m and wt % Co is the weight percentage of Co in the cemented carbide.

The CW-value is a function of the W content in the Co binder phase. A high CW-value corresponds to a low W-content in the binder phase.

It has now been found according to the present invention that improved cutting performance is achieved if the cemented carbide body has a CW-ratio of 0.80–0.92, preferably 0.82–0.91, and most preferably 0.85–0.90. The cemented carbide may contain small amounts, <1 volume %, of η-phase ($M_6C$), without any detrimental effect. From the CW-value it follows that no free graphite is allowed in the cemented carbide body according to the present invention.

The hard and wear resistant refractory coating deposited on the cemented carbide substrate A according to the present invention comprises a first (innermost) thin 0.1–0.5 μm bonding layer of TiN B.

The coating includes a second layer comprising a multilayered structure of sublayers C of the composition $(Ti_xAl_{1-x})N$ in which x varies repeatedly between the two ranges 0.45<x<0.55 and 0.70<x<0.80. The first sublayer of $(Ti_xAl_{1-x})N$ adjacent to the TiN bonding layer having an x-value of 0.45<x<0.55, the second sublayer of $(Ti_xAl_{1-x})N$ having an x-value of 0.70<x<0.80 and the third sublayer having x of 0.45<x<0.55 and so forth repeated until 12–25 sublayers, preferably 22–24 sublayers, are built up. The thickness of this second layer comprising a multilayered structure of sublayers constitutes 75–95% of the total coating thickness. The individual sublayers of $(Ti_xAl_{1-x})N$ are essentially of the same thickness but their thickness may also vary in a regular or irregular way and said sublayer thickness is 0.05–0.2 μm.

The coating further includes a third 0.1–0.5 μm layer of $(Ti_xAl_{1-x})N$ D having an x-value of 0.45<x<0.55, and a fourth (outermost) thin 0.1–0.2 μm layer of TiN E.

The total thickness of the coating is 1–8 μm, preferably 2–5 μm. The layer thickness, the sublayer thickness and the coating thickness quoted above refer to measurements made close to the cutting edge, i.e.—the functional part of the cutting tool.

The present invention will now be further described by reference to the following examples, which are intended to be illustrative rather restrictive.

EXAMPLE 1

A. A cemented carbide parting tool insert in accordance with the present invention with a composition of 12.6 wt-% Co, 1.25 wt-% TaC, 0.30 wt-% NbC and balance WC with a 1.4 μm grain size and with a binder phase alloyed with W corresponding to a CW-ratio of 0.91 was coated with a 4 μm thick coating by applying a conventional PVD cathodic arc technique. The coating consisted of a first (innermost) 0.2 μm layer of TiN followed by a 3.2 μm thick second layer comprising 23 alternating sublayers of $(Ti_xAl_{1-x})N$, where x alternatively varied between 0.55 and 0.75, a third layer 0.2 μm $(Ti_xAl_{1-x})N$ , where x=0.55, and, finally, an outermost 0.4 μm layer of TiN.

B. A cemented carbide parting tool insert not of the present invention with a composition of 8.0 wt-% Co, no cubic carbides, balance WC and a CW-ratio of 0.94. The insert was coated with an innermost 0.5 μm equiaxed TiCN-layer. A 1.5 μm TiN layer was deposited, during the same cycle, on top of the TiCN-layer. No post treatment was applied.

C. For comparison, a competitive cemented carbide parting tool insert in style similar to previously mentioned inserts was obtained from an external leading cemented carbide producer. The carbide had a composition of 12.5 wt-% Co, 0.1 wt-% TiC, 1.8 wt-% TaC, 0.2 wt-% NbC, and balance WC with a CW-ratio of 0.87. The insert had a coating consisting of 1.4 μm TiN and, outermost, 1.4 μm TiCN. Examination under a light optical microscope revealed no edge treatment subsequent to coating.

Inserts A, B and C were tested in a parting off to center in stainless steel SS2321 with OD 26 mm. The cutting speed was varied from 86 to 0 m/min with a feed rate of 0.05 mm/r. The wear mechanism was uneven flank wear and chipping.

| Insert | Number of components |
|---|---|
| A | 50 |
| B | 13 |
| C | 41 |

EXAMPLE 2

Inserts A and B were tested at an end user's machine shop in a parting of a stainless steel component (AISI 316 OD 42 mm). The cutting speed was varied from 110 to 0 m/min with a feed rate varying from 0.08 to 003 mm/r. The low feed rate was used close to the center of the bar. The wear mechanism was fracture in the cutting zone.

| Insert | Number of components |
|---|---|
| A | 201 |
| B | 224 |

EXAMPLE 3

Inserts A and B were tested at an end user's machine shop in a parting of a steel component (SS2172 OD 47 mm). The rotating speed was 1800 rpm with a feed rate of 0.1 mm/r. The wear mechanism was flank wear and flaking.

| Insert | Number of components |
|---|---|
| A | 163 |
| B | 50 |

EXAMPLE 4

Inserts A and C were tested at an end user's machine shop in a parting of a stainless steel component (AISI 316 OD 31 mm). The cutting speed was varied from 60 to 0 m/min with a feed rate varying from 0.06 to 0.03 mm/r. The low feed rate was used close to the center of the bar. The wear mechanism was flank wear and chipping.

| Insert | Number of components |
|---|---|
| A | 182 |
| C | 43 |

The present invention also relates to a method of making a coated cutting tool insert consisting of a cemented carbide body with a composition of 11.5–13.6 wt % Co, preferably 12.0–13.0 wt % Co, most preferably 12.3–12.9 wt % Co, 0.2–1.8 wt % cubic carbides, preferably 0.4–1.8 wt % cubic carbides, most preferably 0.5–1.7 wt % cubic carbides of the metals Ta, Nb and Ti and balance WC. The cemented carbide may also contain other carbides from elements from group IVb, Vb or VIb of the periodic table. The content of Ti is preferably on a level corresponding to a technical impurity. The average grain size of the WC is about 1.1–2.1 μm, preferably about 1.4 μm.

The hard and wear resistant refractory coating is deposited onto the cemented carbide substrate by applying conventional PVD (Physical Vapor Deposition) or CVD (Chemical Vapor Deposition) methods and, according to the present invention, said coating comprises a first (innermost) thin 0.1–0.5 μm bonding layer of TiN, a second layer comprising a multilayered structure of sublayers of the composition $(Ti_xAl_{1-x})N$ in which x varies repeatedly between the two ranges 0.45<x<0.55 and 0.70<x<0.80. The first sublayer of $(Ti_xAl_{1-x})N$ adjacent to the TiN bonding layer having an x-value of 0.45<x<0.55, the second sublayer of $(Ti_xAl_{1-x})N$ having an x-value of 0.70<x<0.80 and the third sublayer having x of 0.45<x<0.55 and so forth repeated until 12–25 sublayers, preferably 22–24 sublayers, are built up. The thickness of this second layer comprising a multilayered structure of sublayers constitutes 75–95% of the total coating thickness. The individual sublayers of $(Ti_xAl_{1-x})N$ are essentially of the same thickness but their thickness may also vary in a regular or irregular way and said sublayer thickness is 0.05–0.2 μm, a third thin 0.1–0.5 μm layer of $(Ti_xAl_{1-x})N$ having an x-value of 0.45<x<0.55 and a fourth (outermost) 0.1–0.2 μm layer of TiN.

Although the present invention has been described in connection with preferred embodiments thereof, it will be appreciated by those skilled in the art that additions, deletions, modifications, and substitutions not specifically described may be made without department from the spirit and scope of the invention as defined in the appended claims.

What is claimed is:

1. A cutting tool comprising:

a cemented carbide body comprising WC with an average grain size of about 1.4 μm, 12–13 wt-% Co, 0.4–1.8 wt-% TaC+NbC, and a low W-alloyed binder phase with a CW-ratio of 0.82–0.91; and a coating comprising:

a first innermost 0.1–0.5 μm thick layer of TiN;

a second layer comprising a multilayered structure of 0.05–0.2 μm thick sublayers of a composition $(Ti_xAl_{1-x})N$ in which x varies repeatedly between the two ranges 0.45<x<0.55 and 0.70<x<0.80, a first sublayer of $(Ti_xAl_{1-x})N$ adjacent to the TiN bonding layer having an x-value of 0.45<x<0.55, a second sublayer of $(Ti_xAl_{1-x})N$ having an x-value of 0.70<x<0.80 and a third sublayer having x of 0.45<x<0.55, the sequence of sublayers alternating and repeating until 12–25 sublayers are built up;

a third 0.1–0.5 μm thick layer of $(Ti_xAl_{1-x})N$, where x is 0.45<x<0.55; and a fourth outermost 0.1–0.2 μm layer of TiN;

wherein the total coating thickness is 1–8 μm and the thickness of the second layer constitutes 75–95% of the total coating thickness.

2. The cutting tool according to claim 1 wherein the cemented carbide body has a composition comprising 12.3–12.9 wt-% Co and 0.5–1.7 wt % TaC+NbC.

3. The cutting tool according to claim 1 wherein the cemented carbide body is free from graphite.

* * * * *